United States Patent
Cho et al.

(10) Patent No.: US 8,791,846 B2
(45) Date of Patent: Jul. 29, 2014

(54) APPARATUS AND METHOD FOR CALIBRATING OFFSET VOLTAGE AND CONTINUOUS TIME DELTA-SIGMA MODULATION APPARATUS INCLUDING THE SAME

(71) Applicant: Electronics and Telecommunications Research Institute, Daejeon (KR)

(72) Inventors: Young Kyun Cho, Daejeon (KR); Jae Ho Jung, Daejeon (KR); Kwangchu Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 53 days.

(21) Appl. No.: 13/707,135

(22) Filed: Dec. 6, 2012

(65) Prior Publication Data

US 2014/0022102 A1    Jan. 23, 2014

(30) Foreign Application Priority Data

Jul. 17, 2012   (KR) .......................... 10-2012-0077916

(51) Int. Cl.
    *H03M 3/00* (2006.01)
(52) U.S. Cl.
    USPC ............ 341/143; 341/118; 341/120; 341/155
(58) Field of Classification Search
    CPC . H03M 1/1061; H03M 1/1023; H03M 3/384; H03M 1/0607; H03M 1/10; H03M 1/46; H03M 3/458; H03M 1/1009; H03M 3/38
    USPC .................................. 341/118, 120, 143, 155
    See application file for complete search history.

(56) References Cited

U.S. PATENT DOCUMENTS 5,030,954 A * 7/1991 Ribner .......................... 341/172
5,392,039 A * 2/1995 Thurston ....................... 341/143

(Continued)

FOREIGN PATENT DOCUMENTS

| KR | 10-0826464 | 5/2008 |
| KR | 1020100069126 | 6/2010 |
| KR | 10-1009077 | 1/2011 |
| KR | 1020110090883 | 8/2011 |

OTHER PUBLICATIONS

Alpman, Erkan et al., "A 1.1V 50mW 2.5GS/s 7b, Time-Interleaved C-2C SAR ADC in 45nm LP Digital CMOS," IEEE International Solid-State Circuits Conference, 33 pages (2009).

(Continued)

*Primary Examiner* — Linh Nguyen
(74) *Attorney, Agent, or Firm* — Nelson Mullins Riley & Scarborough LLP

(57) ABSTRACT

When an enable signal representing an offset calibration mode is received, a continuous time delta-sigma modulation apparatus generates a first signal using first and second pulse signals representing outputs of the continuous time delta-sigma modulation apparatus and an operation frequency of the continuous time delta-sigma modulation apparatus, generates first and second output bits by performing a counting operation according to a counting method that is determined according to a pulse signal of first and second comparators, applies a voltage corresponding to the first output bit to a body of a first transistor of a primary integrator, and applies a voltage corresponding to the second output bit to a body of a second transistor of the primary integrator.

20 Claims, 10 Drawing Sheets

(56) References Cited

U.S. PATENT DOCUMENTS

| | | | |
|---|---|---|---|
| 6,191,715 B1* | 2/2001 | Fowers | 341/120 |
| 7,098,827 B2* | 8/2006 | Motz | 341/143 |
| 7,212,587 B2 | 5/2007 | Khlat et al. | |
| 7,250,886 B1* | 7/2007 | Killat et al. | 341/143 |
| 7,319,852 B2 | 1/2008 | Schlegel et al. | |
| 7,411,534 B1* | 8/2008 | Melanson | 341/131 |
| 7,629,906 B2* | 12/2009 | Juang et al. | 341/118 |
| 7,994,958 B2 | 8/2011 | Quiquempoix et al. | |
| 8,159,380 B2* | 4/2012 | Le Guillou et al. | 341/143 |
| 8,643,518 B2* | 2/2014 | da Silva et al. | 341/120 |
| 2007/0216557 A1* | 9/2007 | Ebner et al. | 341/143 |
| 2009/0085785 A1* | 4/2009 | Gerfers et al. | 341/143 |
| 2010/0150262 A1 | 6/2010 | Kim et al. | |
| 2010/0214142 A1* | 8/2010 | Akizuki et al. | 341/143 |
| 2011/0018605 A1 | 1/2011 | Cho et al. | |
| 2011/0063146 A1 | 3/2011 | Matthews et al. | |

OTHER PUBLICATIONS

Chen, Hsin-Liang et al., "A Low-Offset Low-Noise Sigma-Delta Modulator With Pseudorandom Chopper-Stabilization Technique," IEEE Transactions on Circuits and Systems—I: Regular Papers, vol. 56(12):2533-2543 (2009).

* cited by examiner

APPARATUS AND METHOD FOR CALIBRATING OFFSET VOLTAGE AND CONTINUOUS TIME DELTA-SIGMA MODULATION APPARATUS INCLUDING THE SAME

CROSS-REFERENCE TO RELATED APPLICATION

This application claims priority to and the benefit of Korean Patent Application No. 10-2012-0077916 filed in the Korean Intellectual Property Office on Jul. 17, 2012, the entire contents of which are incorporated herein by reference.

BACKGROUND OF THE INVENTION (a) Field of the Invention

The present invention relates to an apparatus and method for calibrating an offset voltage, and a continuous time delta-sigma modulation apparatus including the same.

(b) Description of the Related Art

For high spectral efficiency, a next generation wireless communication system such as 3rd generation partnership project (3GPP) long term evolution (LTE) and worldwide interoperability for microwave access (WiMAX) uses a modulated wideband signal through orthogonal frequency division multiplexing (OFDM). Therefore, development of a high efficiency transmitter for reducing direct current (DC) power consumption is necessary. Accordingly, an effort for maximizing efficiency has been executed through various structures of power amplifiers such as a Doherty power amplifier and an envelope tracking amplifier. Such a power amplifier is characterized in that a non-constant envelope signal is applied to an input of the power amplifier. When a signal having a large peak to average power ratio (PAPR) is applied to an input of the amplifier, non-linearity of the amplifier increases and thus there is a limitation in improving efficiency of the power amplifier.

In order to overcome a drawback of such a power amplifier, a structure that can embody a transmitter using a switch mode power amplifier (SMPA) instead of a general power amplifier has been suggested.

An input to the SMPA is limited to a signal having a constant envelope, and in order to generate such an input signal, methods such as envelope delta-sigma modulation (EDSM) and envelop pulse width modulation (EPWM) have been suggested. Because the SMPA always operates in a saturation area through such a modulation, linearity of a non-constant envelope signal is guaranteed and high switching efficiency is obtained. A power amplifier of a structure including both an SMPA and a modulation apparatus for converting a non-constant envelope signal to a constant envelope signal is referred to as a class-S power amplifier.

A transmission apparatus using an EDSM method mainly uses a polar coordinate conversion modulation method that separates and transmits a phase signal and an envelope signal. The transmitting apparatus uses a low pass delta-sigma modulator (LPDSM). That is, a transmission apparatus using an EDSM method includes an LPDSM, a phase modulator, a mixer, a power amplifier, and a band pass filter. Envelope information of an input signal is output by a signal in which a pulse width is modulated through the LPDSM, and phase information is output through a phase modulator. An envelope signal and a phase signal are combined by a mixer in a back stage of an LPDSM and a phase modulator, and thus an output of the mixer has a sine wave form having 0 or a constant amplitude, and an output of such a mixer drives a power amplifier of a saturation mode. An output of the power amplifier removes out-of-band quantization noise through a band passage filter, and thus a transmission apparatus using an EDSM method obtains a characteristic of a linear amplifier having high power efficiency.

In order to improve an adjacent channel leakage power ratio (ACLR) by increasing a signal-to-quantization noise ratio (SQNR) by operating with a high over-sampling ratio (OSR), a DSM that is used for such a transmission apparatus uses a continuous-time DSM that can use a high clock frequency. Further, in order to improve an ACLR and error vector magnitude (EVM) characteristics by increasing coding efficiency of a transmission apparatus, the DSM has an order of a second or more, and an output level uses a multiple level of 3 or more.

An envelope signal that is applied to an input of a continuous time DSM through spectrum density analysis is a long-term evolution (LTE) signal having a signal band of approximately 20 MHz, and the signal has a characteristic of a form in which a large amount of signals exist around a DC and in which a predetermined portion of signal magnitude is attenuated according to a bandwidth and in which some degree of signal magnitude is maintained even in an out-of-band. In order to process such a signal, a continuous time DSM should be able to accurately process a signal around a DC, and for this purpose, the continuous time DSM should be insensitively designed for DC offset. Even if a DSM that is used for an EDSM method is not exemplified, a continuous time DSM that is used for a specific system should be insensitively designed for offset or be designed to calibrate offset. Offset that is generated by a cause such as a mismatch of a circuit and an external interference source changes according to other temporal operation conditions such as gain, frequency, temperature, and signal fading, and when the offset is not efficiently removed, signal quality is deteriorated, a dynamic range is limited by circuit saturation, and power consumption increases.

SUMMARY OF THE INVENTION

The present invention has been made in an effort to provide a method and apparatus for calibrating an offset voltage that can calibrate a DC offset voltage through a simple circuit technique, and a continuous time delta-sigma modulation apparatus including the same.

An exemplary embodiment of the present invention provides an apparatus that calibrates an offset voltage in a continuous time delta-sigma modulation apparatus including a primary integrator and a secondary integrator. The apparatus includes a first logic element, a second logic element, a first digital to analog converter (DAC), a second DAC, and a counter. The first logic element generates a first signal by performing a logic operation of first and second pulse signals representing an output of the continuous time delta-sigma modulation apparatus and an operation frequency of the continuous time delta-sigma modulation apparatus. The second logic element generates a switch control signal that resets an integral capacitor of the primary integrator and the secondary integrator by performing a logic operation of the first signal and an enable signal representing the start of an offset calibration mode. The first DAC applies a voltage corresponding to a first output bit to a body of a first transistor of the primary integrator. The second DAC applies a voltage corresponding to a second output bit to a body of a second transistor of the primary integrator. The counter determines up-counting or down-counting according to the first and second pulse signals, and generates the first and second output bits in response to the first signal and outputs the first and second output bits to the first and second DACs, respectively.

In the offset calibration mode, a common mode voltage may be input to the primary integrator, and a value that is fed back to the primary and secondary integrators may be determined so that the first and second pulse signals have an intermediate value.

The apparatus may further include an exclusive-NOR element and a logic inversion element. The exclusive-NOR element may perform an exclusive-NOR operation of the first and second pulse signals and output a signal in which the exclusive-NOR operation is performed to the first logic element. The logic inversion element may invert the operation frequency and output the inverted operation frequency to the first logic element.

The first and second logic elements may include an AND element, respectively.

The first transistor may include a first input transistor that receives an input of a positive input signal of differential input signals of the primary integrator, and the second transistor may include a second input transistor that receives an input of a negative input signal of the differential input signals.

The first transistor may include a first load transistor having a first terminal that is connected to a voltage source that supplies a power voltage and a second terminal that is connected to a first input transistor that receives an input of a positive input signal of differential input signals, and the second transistor may include a second load transistor having a first terminal that is connected to the voltage source and a second terminal that is connected to a second input transistor that receives an input of a negative input signal of the differential input signals.

One of the first and second output bits may be set to be changed according to up-counting or down-counting, and the remaining one may be set as a value representing 0 V according to the offset voltage.

The apparatus may further include a controller. The controller may define a pass down value and a pass up value according to a counting method of the counter and set the pass down value to 1 when the counter determines down-counting and set the pass up value to 1 when the counter determines up-counting, and terminate the offset calibration mode when both the pass down value and the pass up value are set to 1.

Another embodiment of the present invention provides a method of calibrating an offset voltage in a continuous time delta-sigma modulation apparatus including a primary integrator, a secondary integrator, first and second comparators that determine outputs. The method may include: receiving an enable signal representing an offset calibration mode; generating a first signal using pulse signals of the first and second comparators and an operation frequency of the continuous time delta-sigma modulation apparatus; generating first and second output bits by determining up-counting or down-counting according to pulse signals of the first and second comparators and performing a counting operation according to the determined counting method; applying a voltage corresponding to the first output bit to a body of a first transistor of the primary integrator; and applying a voltage corresponding to the second output bit to a body of a second transistor of the primary integrator.

The method may further include resetting an integral capacitor of the primary and secondary integrators according to the first signal.

The generating of a first signal may include: performing an exclusive-NOR operation of a pulse signal of the first and second comparators; and generating the first signal by performing an AND operation of a signal in which the exclusive-NOR operation is performed and a signal in which an operation frequency of the continuous time delta-sigma modulation apparatus is inverted.

The generating of first and second output bits may include: determining the up-counting or the down-counting according to a pulse signal of the first and second comparators when a positive offset voltage occurs in a negative input signal of differential input signals of the primary integrator; generating the first output bit by performing the up-counting or the down-counting; and generating the second output bit with a value representing 0 V.

The determining of the up-counting or the down-counting may include determining down-counting when all pulse signals of the first and second comparators are 0, and determining up-counting when all pulse signals of the first and second comparators are 1.

The method may further include: repeating operations of generating the first signal according to the operation frequency, generating the first and second output bits, and applying them to a body of the first and second transistors; setting a pass up value to 1 according to the up-counting, and setting a pass down value to 1 according to the down-counting; and terminating the offset calibration mode when both the pass up value and the pass down value are set to 1.

Yet another embodiment of the present invention provides a continuous time delta-sigma modulation apparatus. The continuous time delta-sigma modulation apparatus includes an integrator, first and second comparators, a first DAC, and an offset voltage calibration unit. The integrator integrates a differential input signal using a resistor and a capacitor. The first and second comparators determine first and second pulse signals, respectively, using a differential input signal of the integrator. The first DAC converts the first and second pulse signals of the first and second comparators to analog values and feeds back the output signal to the integrator. The offset voltage calibration unit adjusts a body voltage of one of first and second transistors that receive the differential input signal in the integrator by determining up-counting or down-counting according to the first and second pulse signals and performing a counting operation according to the determined counting method in an offset calibration mode.

The continuous time delta-sigma modulation apparatus may further include a first multiplexer and a second multiplexer. The first multiplexer may select the differential input signal as a common mode voltage according to an enable signal representing the offset calibration mode. The second multiplexer may select a value for setting the first and second pulse signals of the first and second comparators to an intermediate value and output the value to the first DAC according to the enable signal.

The continuous time delta-sigma modulation apparatus may further include a switch that is coupled in parallel to a capacitor of the integrator. The offset voltage calibration unit may generate a switch control signal that resets the capacitor according to the first and second pulse signals and output the switch control signal to the switch.

The offset voltage calibration unit may include: an AND element that generates a first signal by performing an AND operation of a pulse signal of the first and second comparators and an operation frequency of the continuous time delta-sigma modulation apparatus; a counter that determines up-counting or down-counting according to a pulse signal of the first and second comparators and that performs counting; and a second DAC that applies a voltage corresponding to an output bit of the counter to a body of one of the first and second transistors that receive an input of an differential input signal of the primary integrator.

The offset voltage calibration unit may further include a controller that sets a pass up value to 1 according to an up-counting and that sets a pass down value to 1 according to a down-counting and that terminates the offset calibration mode when both the pass up value and the pass down value are set to 1.

DETAILED DESCRIPTION OF THE EMBODIMENTS

Figure 1:
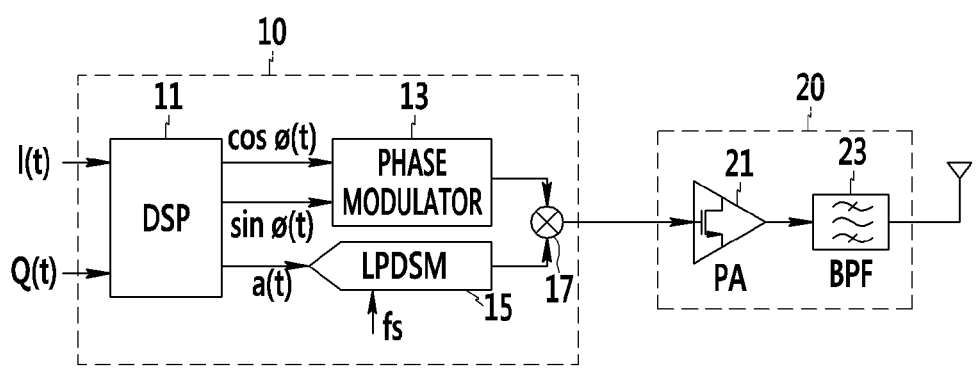
FIG. 1 is a diagram illustrating a structure and concept of a class-S power amplifier.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification and claims, unless explicitly described to the contrary, the word "comprise" and variations such as "comprises" or "comprising" will be understood to imply the inclusion of stated elements but not the exclusion of any other elements.

Hereinafter, a method and apparatus for calibrating an offset voltage and a continuous time delta-sigma modulation apparatus including the same according to an exemplary embodiment of the present invention will be described in detail with reference to the drawings.

Figure 2:
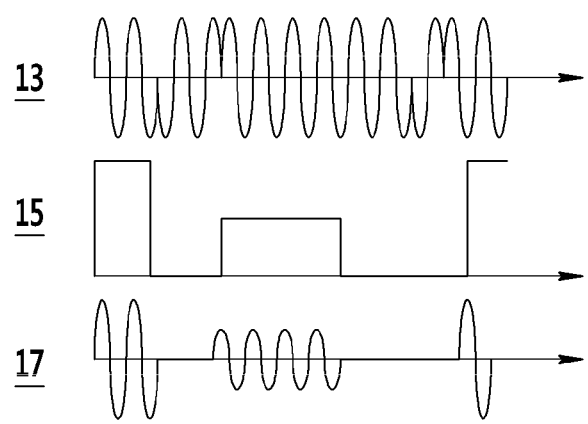
FIG. 2 is a diagram illustrating output waveforms of a phase modulator, an LPDSM, and a mixer that are shown in FIG. 1.

FIG. 1 is a diagram illustrating a structure and concept of a class-S power amplifier, and FIG. 2 is a diagram illustrating output waveforms of a phase modulator, an LPDSM, and a mixer that are shown in FIG. 1.

As shown in FIG. 1, the class-S power amplifier includes a switch mode power amplifier (SMPA) 20 and a modulation apparatus 10 that converts a non-constant envelope signal to a constant envelope signal.

The SMPA 20 includes a power amplifier (PA) 21 and a band pass filter (BPF) 23, and in the PA 21, an input signal is amplified, and in the BPF 23, the amplified signal is band-pass filtered and output.

In this case, in order to generate a signal having a constant envelope with the input signal of the PA 21, the modulation apparatus 10 uses a method such as envelope delta-sigma modulation (EDSM) or envelope pulse width modulation (EPWM). FIG. 1 illustrates a modulation apparatus using an EDSM method.

The modulation apparatus 10 using an EDSM method mainly uses a polar coordinate conversion modulation method of separating and transmitting a phase signal and an envelope signal from baseband I and Q signals [I(t), Q(t)].

The modulation apparatus 10 includes a digital signal processing (DSP) 11, a phase modulator 13, a low pass delta-sigma modulator (LPDSM) 15, which is a kind of a continuous time DSM, and a mixer 17.

The DSP 11 calculates a magnitude [a(t)] and a phase [φ(t)] of a baseband signal from baseband I and Q signals [I(t), Q(t)] using a coordinate rotation digital computer (CORDIC) algorithm, outputs a phase signal [cos φ(t), sin φ(t)] to the phase modulator 13, and outputs the calculated magnitude signal [a(t)] to the LPDSM 15.

As shown in FIG. 2, the phase signal [cos φ(t), sin φ(t)] that is input to the phase modulator 13 is phase-modulated by the phase modulator 13, and the magnitude signal [a(t)] that is input to the LPDSM 15 is delta-sigma modulated by the LPDSM 15. The phase-modulated signal and the delta-sigma modulated signal are combined by the mixer 17. Thereby, an output of the mixer 17 becomes a constant envelope signal of a sine wave shape having 0 or a constant magnitude, and such a constant envelope signal is input to the SMPA 20 and drives the SMPA 20.

An output signal of the mixer 17 is input to the PA 21 of the SMPA 20 and amplified, and out-of-band quantization noise of the amplified signal is removed by passing through the BPF 23. The signal in which quantization noise is removed is transmitted through a transmitting antenna. Thereby, a characteristic of a linear amplifier having high power efficiency can be obtained.

Figure 3:
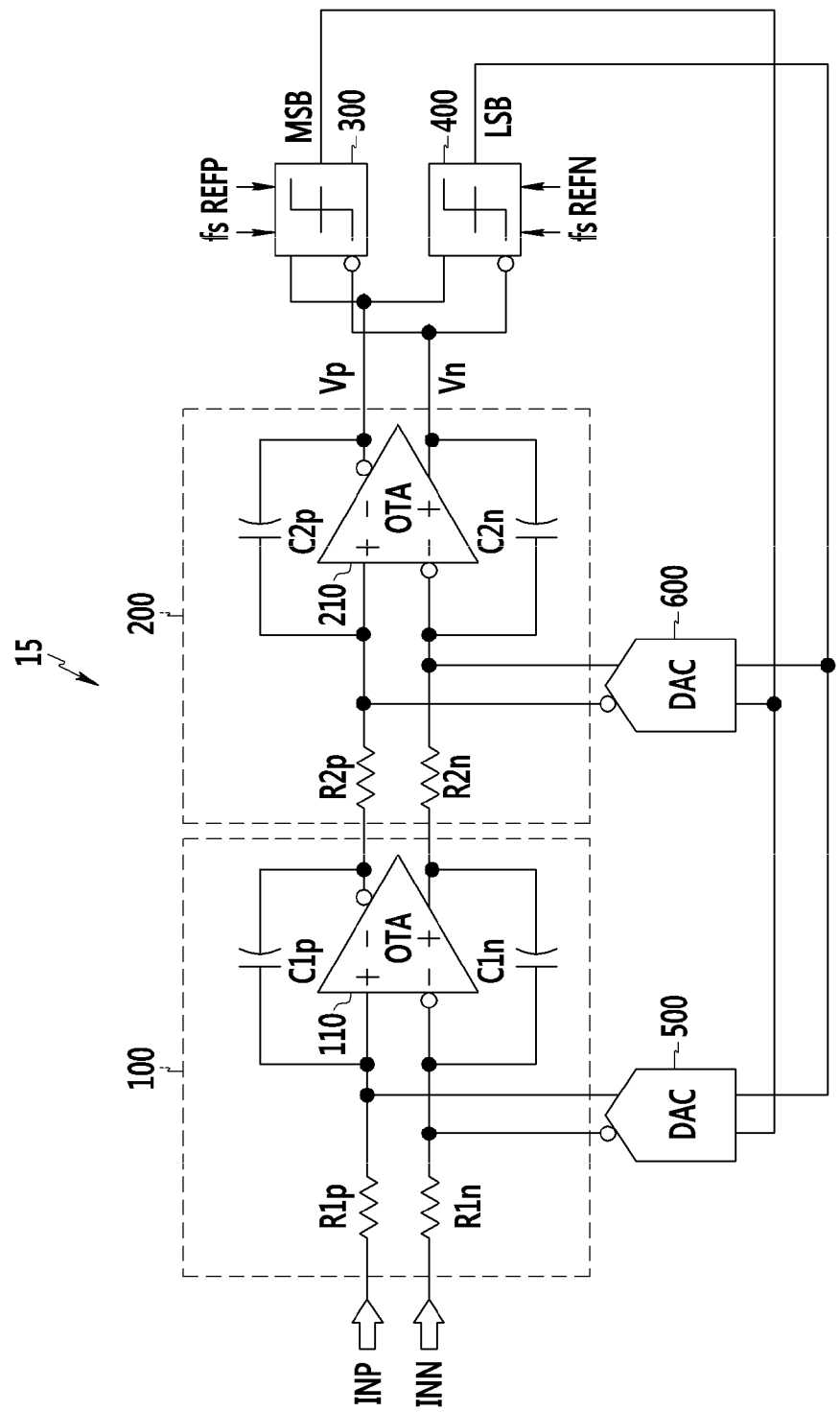
FIG. 3 is a diagram illustrating an example of an LPDSM that is shown in FIG. 1.

FIG. 3 is a diagram illustrating an example of an LPDSM that is shown in FIG. 1.

The LPDSM 15 that is shown in FIG. 3 is a secondary 3-level LPDSM of a differential input and differential output structure, and the LPDSM 15 of such a structure includes a primary integrator 100, a secondary integrator 200, comparators 300 and 400, and digital to analog converters (DAC) 500 and 600.

FIG. 3 illustrates an active RC structure using a resistor and a capacitor as the primary and secondary integrators 100 and 200, but a gm-C structure using transconductance and a capacitor as the primary and secondary integrators 100 and 200 may be used.

The primary integrator 100 integrates differential input signals INP and INN to a magnitude signal [a(t)]. The primary integrator 100 includes resistors R1p and R1n, integral capacitors C1p and C1n, and an operational transconductance amplifier (OTA) 110.

The resistor R1p is connected between an input terminal of the LPDSM 15 to which a positive input signal INP is input and a positive input terminal of differential input terminals of the OTA 110. Further, a negative output terminal of differential output terminals of the DAC 500 is connected to a negative input terminal of the OTA 110, and the integral capacitor C1p is connected between the positive input terminal of the OTA 110 and the negative output terminal of the OTA 110. The resistor R1n is connected between an input terminal of the LPDSM 15 to which the positive input signal INP is input and a negative input terminal of differential input terminals of the OTA 110. Further, a positive output terminal of differential output terminals of the DAC 500 is connected to the positive input terminal of the OTA 110. The integral capacitor C1n is connected between the negative input terminal and the positive output terminal of the OTA 110.

The primary integrator 100 inversely integrates and outputs the positive input signal INP and inversely integrates and outputs the negative input signal INN. In this case, an output of the primary integrator 100 is changed according to a time constant τs=RC. Here, R represents a value of resistors R1p and R1n, and C represents a value of the integral capacitors C1p and C1n.

The secondary integrator 200 integrates an output signal of the primary integrator 100. The secondary integrator 200 includes resistors R2p and R2n, capacitors C2p and C2n, and an OTA 210.

The resistor R2p is connected between the negative output terminal of the primary integrator 100 and a positive input terminal of differential input terminals of the OTA 210. Further, a negative output terminal of differential output terminals of the DAC 600 is connected to a positive input terminal of the OTA 210. The integral capacitor C2p is connected between the positive input terminal of the OTA 210 and a negative output terminal of the OTA 210. The resistor R2n is connected between a positive output terminal of the primary integrator 100 and a negative input terminal of differential phase input terminals of the OTA 210. Further, a positive output terminal of differential phase output terminals of the DAC 600 is connected to a negative input terminal of the OTA 210. The integral capacitor C2n is connected between the negative input terminal of the OTA 210 and the positive output terminal of the OTA 210.

Operation of such a secondary integrator 200 is the same as that of the primary integrator 100. That is, the secondary integrator 200 inversely integrates and outputs a signal of a negative output terminal of the primary integrator 100 and inversely integrates and outputs a signal of a positive output terminal of the primary integrator 100. An output of such a secondary integrator 200 also changes according to a time constant.

The comparators 300 and 400 compare differential output signals Vp and Vn of the secondary integrator 200 with reference voltages REFP and REFN, respectively, and determine an output voltage. The comparators 300 and 400 operate in synchronization with an operation frequency fs. The comparators 300 and 400 compare a difference between voltages Vp and Vn of a differential output signal of the secondary integrator 200 with the reference voltages REFP and REFN and output pulse signals MSB and LSB of 0 or 1 to the DACs 500 and 600, respectively according to a comparison result. The comparators 300 and 400 may use, for example, a flash analog to digital converter (ADC).

The DAC 500 and 600 feed back the pulse signals MSB and LSB of the comparators 300 and 400 to the primary integrator 100 and the secondary integrator 200. The DAC 500 receives an input of the pulse signals MSB and LSB of the comparators 300 and 400 as a feedback signal, converts a digital signal to an analog signal, outputs a negative analog signal to a negative input terminal of the OTA 110, and outputs a positive analog signal to a positive input terminal of the OTA 110. The DAC 600 receives an input of the pulse signals MSB and LSB of the comparators 300 and 400 as a feedback signal, converts a digital signal to an analog signal, outputs a negative analog signal to a positive input terminal of the OTA 210, and outputs a positive analog signal to a negative input terminal of the OTA 210.

Figure 4:
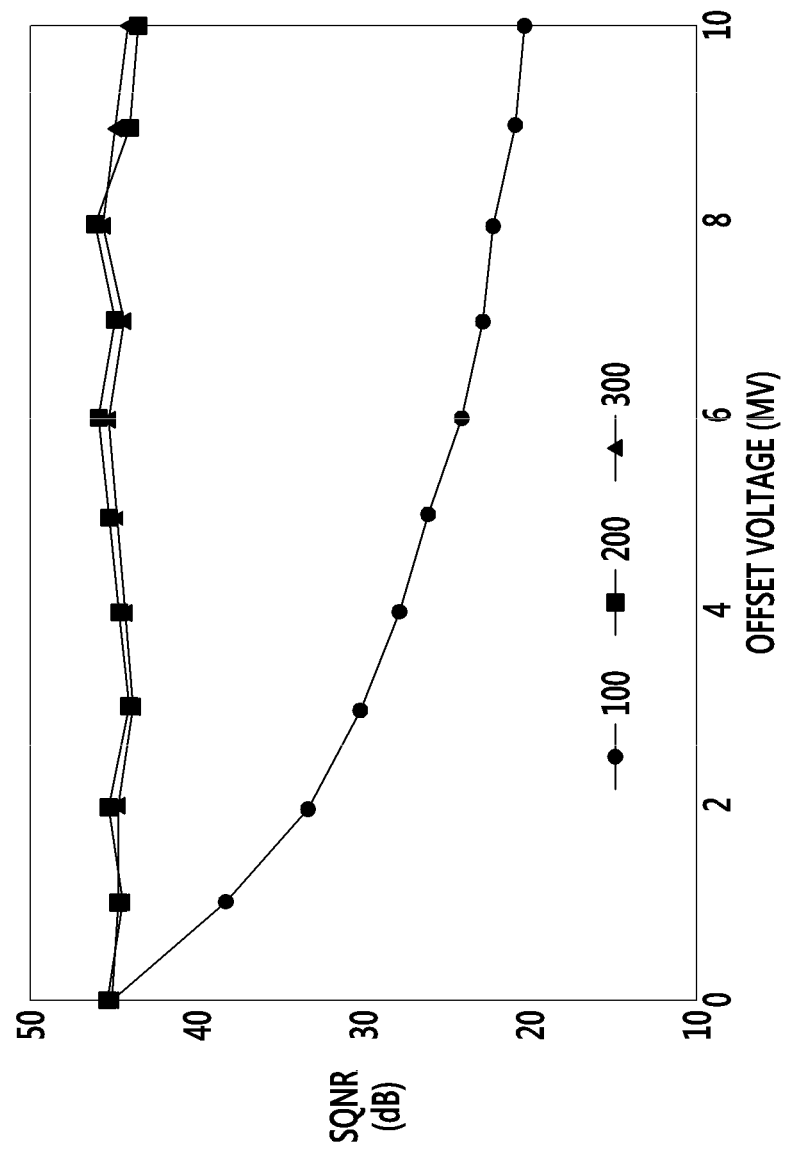
FIG. 4 is a graph illustrating SQNR characteristics when offset exists in an input of a primary integrator, a secondary integrator, and a comparator that are shown in FIG. 3.

FIG. 4 is a graph illustrating SQNR characteristics when offset exists at an input of a primary integrator, a secondary integrator, and a comparator that are shown in FIG. 3.

Referring to FIG. 4, when offset exists at an input of the secondary integrator 200 and an input of the comparator 300 or 400, even if an offset voltage increases, it can be determined that SQNR characteristics are equally maintained. Such a result is obtained because an offset effect is attenuated through a voltage gain of the OTA 110 of the primary integrator 100.

However, when offset exists at an input of the primary integrator 100, the offset is directly reflected to output spectrum and thus as an offset voltage increases, so an SQNR is rapidly attenuated. Therefore, in order to calibrate offset of the LPDSM 15, when effectively calibrating offset occurring at an input of the primary integrator 100, SQNR characteristics of an entire circuit can be maintained.

Here, when offset exists at an input of the primary integrator 100, it is necessary to review an output waveform. An offset calibration according to an exemplary embodiment of the present invention is performed based on an output waveform that is shown in FIG. 5.

Figure 5:
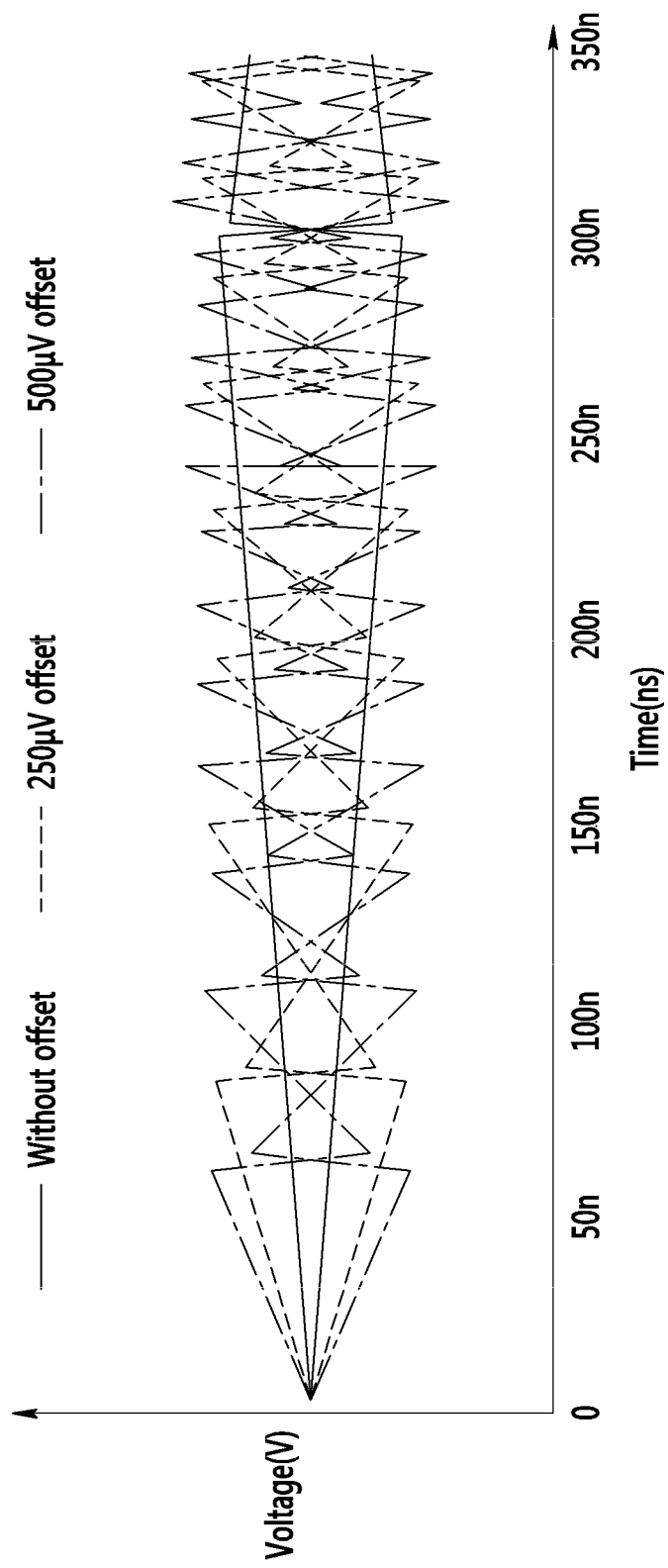
FIG. 5 is a graph illustrating an output voltage waveform of a secondary integrator when offset exists in an input of a primary integrator that is shown in FIG. 3.

FIG. 5 is a graph illustrating an output voltage waveform of a secondary integrator when offset exists at an input of a primary integrator that is shown in FIG. 3.

An output waveform that is shown in FIG. 5 represents output voltages Vp and Vn of the secondary integrator 200 when applying a common mode voltage (CM) to differential input signals INP and INN and applying 0 V, 250 uV, and 500 uV as an offset voltage to an input of the primary integrator 100.

Because the LPDSM 15 is connected with a feedback loop, unlike an open loop circuit, even if a CM voltage is applied to an input, when a long time passes, a state of an output voltage is changed to another state by operation of the secondary integrator 200. In this case, when a difference occurs in a differential operation circuit by an offset voltage, a switching cycle that changes a state of an output voltage of the secondary integrator 200 has faster characteristics.

Referring to FIG. 5, when an offset voltage is 0 (without offset), a switching time of output voltages Vp and Vn of the secondary integrator 200 is about 300 ns, but when offset voltages are 250 uV and 500 uV, switching times of output voltages Vp and Vn of the secondary integrator 200 are shortened to 80 ns and 60 ns, respectively. That is, the LPDSM 15 has a characteristic in which a switch time of the output voltages Vp and Vn of the secondary integrator 200 is shortened as an offset voltage increases.

The LPDSM 15 according to an exemplary embodiment of the present invention calibrates an offset voltage using a characteristic in which a switching time of output voltages Vp and Vn of the secondary integrator 200 is shortened, as an offset voltage increases.

Figure 6:
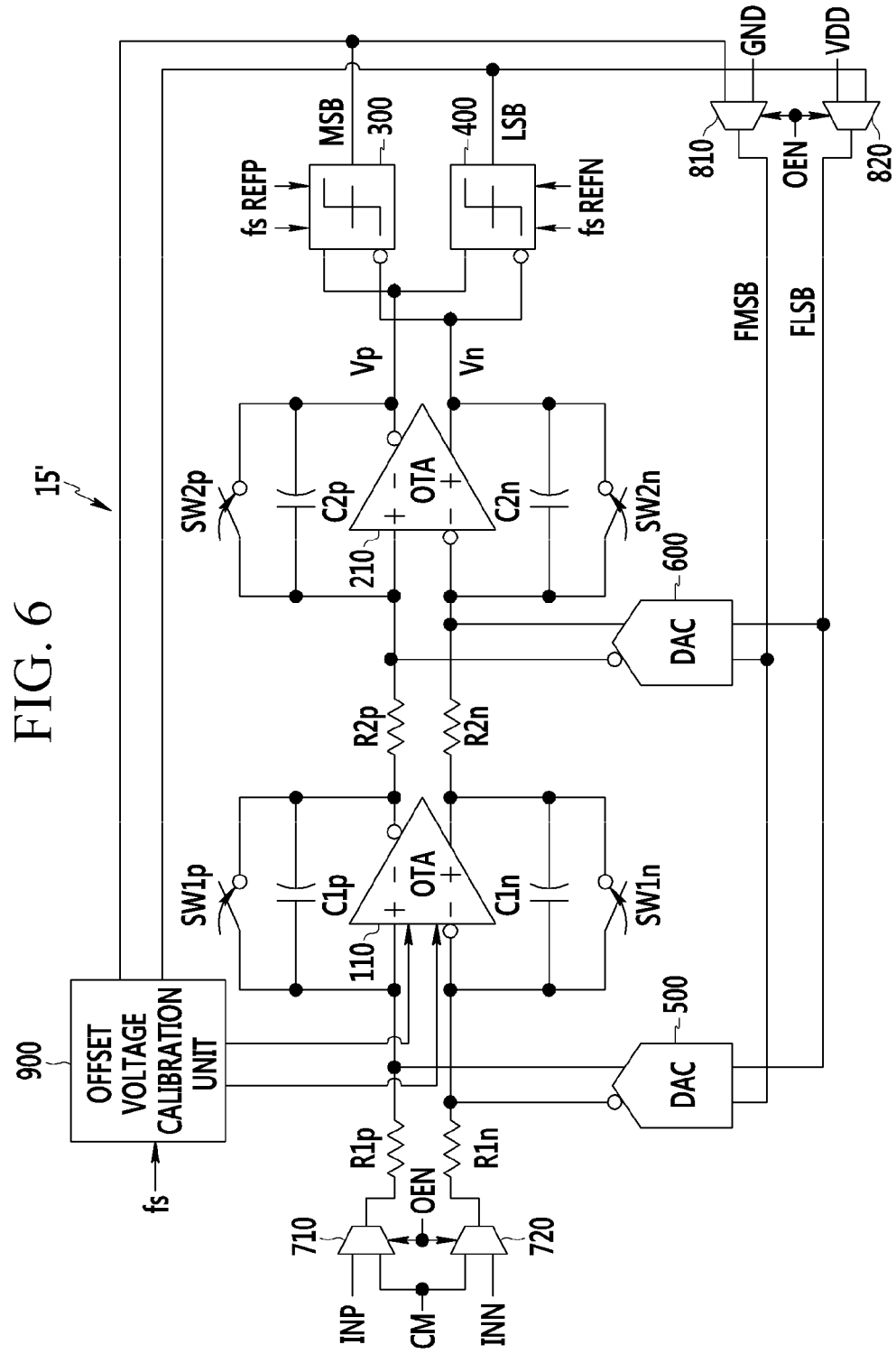
FIG. 6 is a diagram illustrating an LPDSM according to an exemplary embodiment of the present invention.

FIG. 6 is a diagram illustrating an LPDSM according to an exemplary embodiment of the present invention.

Referring to FIG. 6, in order to calibrate an offset voltage, an LPDSM 15' further includes input multiplexers 710 and 720, output multiplexers 810 and 820, and an offset voltage calibration unit 900, compared with the LPDSM 15 that is shown in FIG. 3. Further, a primary integrator 100 further includes switches SW1p and SW1n, and a secondary integrator 200 further includes switches SW2p and SW2n.

The switches SW1p, SW1n, SW2p, and SW2n are turned on/off according to a switch control signal RST that is output from the offset voltage calibration unit 900. When the switches SW1p, SW1n, SW2p, and SW2n are turned on, the capacitors C1p, C1n, C2p, and C2n are reset and thus the primary and secondary integrators 100 and 200 are initialized.

The input multiplexers 710 and 720 each have two input terminals and one output terminal. Output terminals of the input multiplexers 710 and 720 are connected to the resistors R1p and R1n, respectively. The input multiplexer 710 selects one of a positive input signal INP and a CM voltage that are input to two input terminals, respectively, and outputs it through an output terminal according to an enable signal OEN. The input multiplexer 720 selects one of a CM voltage and a negative input signal INN that are input to two input terminals, respectively, and outputs it through an output terminal according to an enable signal OEN. When an enable signal OEN is in a high level, the input multiplexers 710 and 720 select and output a CM voltage, and when an enable signal OEN is in a low level, the input multiplexers 710 and 720 select and output a positive input signal INP and a negative input signal INN, respectively.

The output multiplexers 810 and 820 each have two input terminals and one output terminal. Output terminals of the output multiplexers 810 and 820 are connected to the DACs 500 and 600, respectively. The output multiplexer 810 selects one of a pulse signal MSB and a ground voltage GND of a comparator 300 that are input to two input terminals, respectively, and outputs it through an output terminal according to an enable signal OEN. Further, the output multiplexer 820 selects one of a pulse signal LSB and a power supply voltage VDD of a comparator 400 that are input to two input terminals, respectively, and outputs it through an output terminal according to an enable signal OEN. The output multiplexers 810 and 820 determine output signals FMSB and FLSB, respectively, according to the enable signal OEN. When the enable signal OEN is in a high level, the output multiplexers 810 and 820 select and output 0 and 1 as output signals FMSB and FLSB, respectively, and when the enable signal OEN is in a low level, the output multiplexers 810 and 820 select pulse signals MSB and LSB of the comparators 300 and 400 as the output signals FMSB and FLSB, respectively, and output the pulse signals MSB and LSB.

Here, the enable signal OEN becomes a high level in an offset calibration mode, and when the enable signal OEN becomes a high level, calibration of an offset voltage is started. The control of such an enable signal OEN is performed in a controller (not shown). Such a controller may be embodied within the offset voltage calibration unit 900, but may be a separate constituent element from the offset voltage calibration unit 900 and be embodied as a constituent element of the LPDSM 15'.

The offset voltage calibration unit 900 receives an input of the pulse signals MSB and LSB of the comparators 300 and 400 and calibrates an offset voltage of the primary integrator 110 using the pulse signals MSB and LSB and the operation frequency fs of the comparators 300 and 400. Further, in order to calibrate an offset voltage, the offset voltage calibration unit 900 generates a switch control signal RST using the pulse signals MSB and LSB and the operation frequency fs of the comparators 300 and 400 and controls on/off of the switches SW1p, SW1n, SW2p, and SW2n. In this case, in order to calibrate an offset voltage, the offset voltage calibration unit 900 uses a characteristic in which a switching time of output voltages Vp and Vn of the secondary integrator 200 is shortened, as an offset voltage increases.

Figure 7:
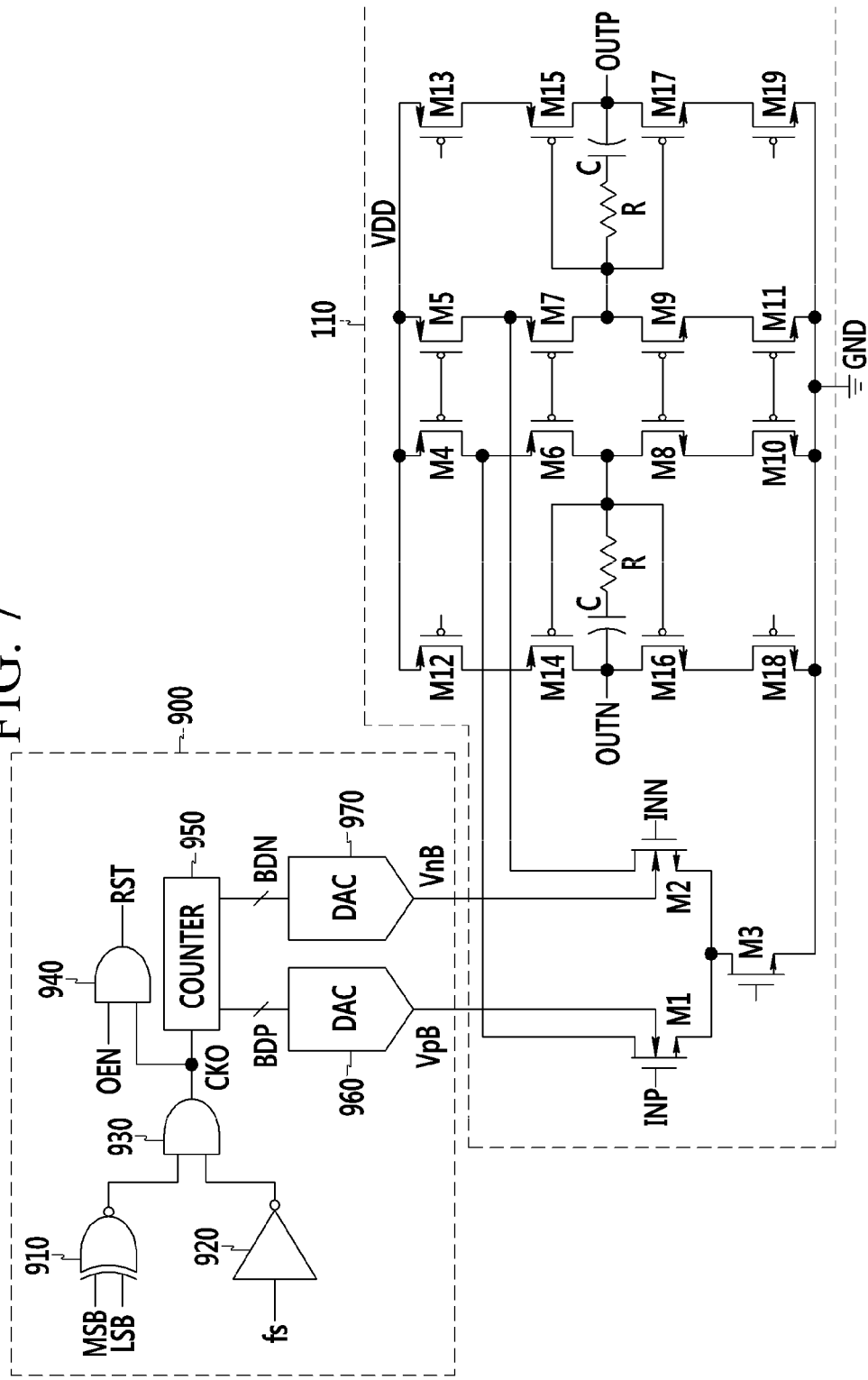
FIG. 7 is a diagram illustrating a detailed configuration of an offset voltage calibration unit and an OTA of a primary integrator that are shown in FIG. 6.

FIG. 7 is a diagram illustrating a detailed configuration of an offset voltage calibration unit and an OTA of a primary integrator that are shown in FIG. 6.

In FIG. 7, an OTA 110 of the primary integrator 100 has a structure in which a folded cascode amplifier and a complementary common source amplifier are connected, and may be formed with an amplifier of other forms of the OTA 110.

The folded cascode amplifier includes transistors M1-M11, and the complementary common source amplifier includes transistors M12-M19. The transistors M1-M19 that are shown in FIG. 7 each are a switch having a control terminal, an input terminal, and an output terminal. FIG. 7 illustrates the transistors M1-M19 as a field effect transistor (FET), and in this case, a control terminal, an input terminal, and an output terminal correspond to a gate, a drain, and a source, respectively.

The OTA 110 that is formed with a folded cascode and a complementary common source amplifier is well-known technology and a detailed description thereof will be omitted, and the OTA 110 of the primary integrator 100 may be formed with an amplifier of a different form from that of FIG. 7.

The offset voltage calibration unit 900 includes an exclusive-NOR (XNOR) element 910, a logic inversion element 920, AND elements 930 and 940, a counter 950, and DACs 960 and 970.

The XNOR element 910 performs an XNOR operation of pulse signals MSB and LSB of the comparators 300 and 400, and outputs the pulse signals MSB and LSB to the AND element 930. When the pulse signals MSB and LSB of the comparators 300 and 400 are a ground voltage GND and a power supply voltage VDD, respectively, the XNOR element 910 outputs a signal of 0.

The logic inversion element 920 inverts an operation frequency fs and outputs the operation frequency fs to the AND element 930.

The AND element 930 performs an AND operation of an output signal of the XNOR element 910 and an output signal of the logic inversion element 920, and outputs the signal to the AND element 940 and the counter 950.

The AND element 940 performs an AND operation of an output signal CKO and an enable signal OEN of the AND element 930, generates a switch control signal RST, and outputs the switch control signal RST to the switches SW1p, SW1n, SW2p, and SW2n. When a switch control signal is in a high level, the switches SW1p, SW1n, SW2p, and SW2n are turned on, and when the switches SW1p, SW1n, SW2p, and SW2n are turned on, the capacitors C1p, C1n, C2p, and C2n are reset.

The counter 950 has both up-counting and down-counting functions, and determines down-counting or up-counting according to the pulse signals MSB and LSB of the comparators 300 and 400. When values of the pulse signals MSB and LSB of the comparators 300 and 400 are 0 and 0, the counter 950 determines down-counting with a counting method, and when values of output signals of the comparators 300 and 400 are 1 and 1, the counter 950 determines up-counting.

The counter 950 is an N-bit counter and outputs an N-bit signal in response to an output signal CKO of the AND element 930. When an offset calibration mode is started by an enable signal OEN, the counter 950 initializes all N-bits to 1 or 0 according to the pulse signals MSB and LSB of the comparators 300 and 400. When values of the pulse signals MSB and LSB of the comparators 300 and 400 are 0 and 0, the counter 950 initializes all N-bits to 1 and performs down-counting. When values of pulse signals MSB and LSB of the comparators 300 and 400 are 1 and 1, the counter 950 initializes all N-bits to 0 and performs up-counting.

An uppermost bit of an N-bit output signal of the counter 950 is determined according to a value of the pulse signals MSB and LSB of the comparators 300 and 400, and is a flag bit representing up-counting or down-counting. A low level (N−1) bit of N-bits represents a counting value, and is increased or decreased according to up-counting or down-counting. In this case, the counter 950 outputs a low level (N−1) bit signal to one of the DACs 960 and 970 according to a value of a flag bit, and outputs an (N−1) bit signal representing 0 V to the remaining DACs. For example, when a value of the flag bit is 1, the counter 950 may output a low level (N−1) bit signal BDP to the DAC 960 and output an (N−1) bit signal BDN representing 0 V to the DAC 960.

The DAC 960 is connected to a body of the input transistor M1 that receives an input of a positive input signal INP of two input transistors M1 and M2 of the OTA 110, and applies a voltage corresponding to an (N−1) bit signal BDP of the counter 950 to a body of the input transistor M1.

The DAC 970 is connected to a body of an input transistor M2 that receives an input of a negative input signal INN of two input transistors M1 and M2 of the OTA 110, and applies a voltage corresponding to an (N−1) bit signal BDN that is output from the counter 950 to a body of the transistor M2.

In this case, a resolution of the counter 950 and the DACs 960 and 970 may be set in consideration of an adjustment range of an offset voltage, and the DACs 960 and 970 may be embodied with a specific circuit that can express bit signals BDP and BDN with a step voltage.

In this way, the offset voltage calibration unit 900 calibrates an offset voltage by adjusting a body voltage of the two input transistors M1 and M2 of the OTA 110 using pulse signals MSB and LSB of the comparators 300 and 400 in an offset calibration mode.

Alternatively, the offset voltage calibration unit 900 may calibrate an offset voltage by adjusting a body voltage of load transistors M4 and M5 of the OTA 110 using pulse signals MSB and LSB of the comparators 300 and 400 in an offset calibration mode. In this case, the DAC 960 is connected to a body of the load transistor M4, and the DAC 970 is connected to a body of the load transistor M5.

Hereinafter, operation of the offset voltage calibration unit 900 will be described in detail with reference to FIG. 8.

Figure 8:
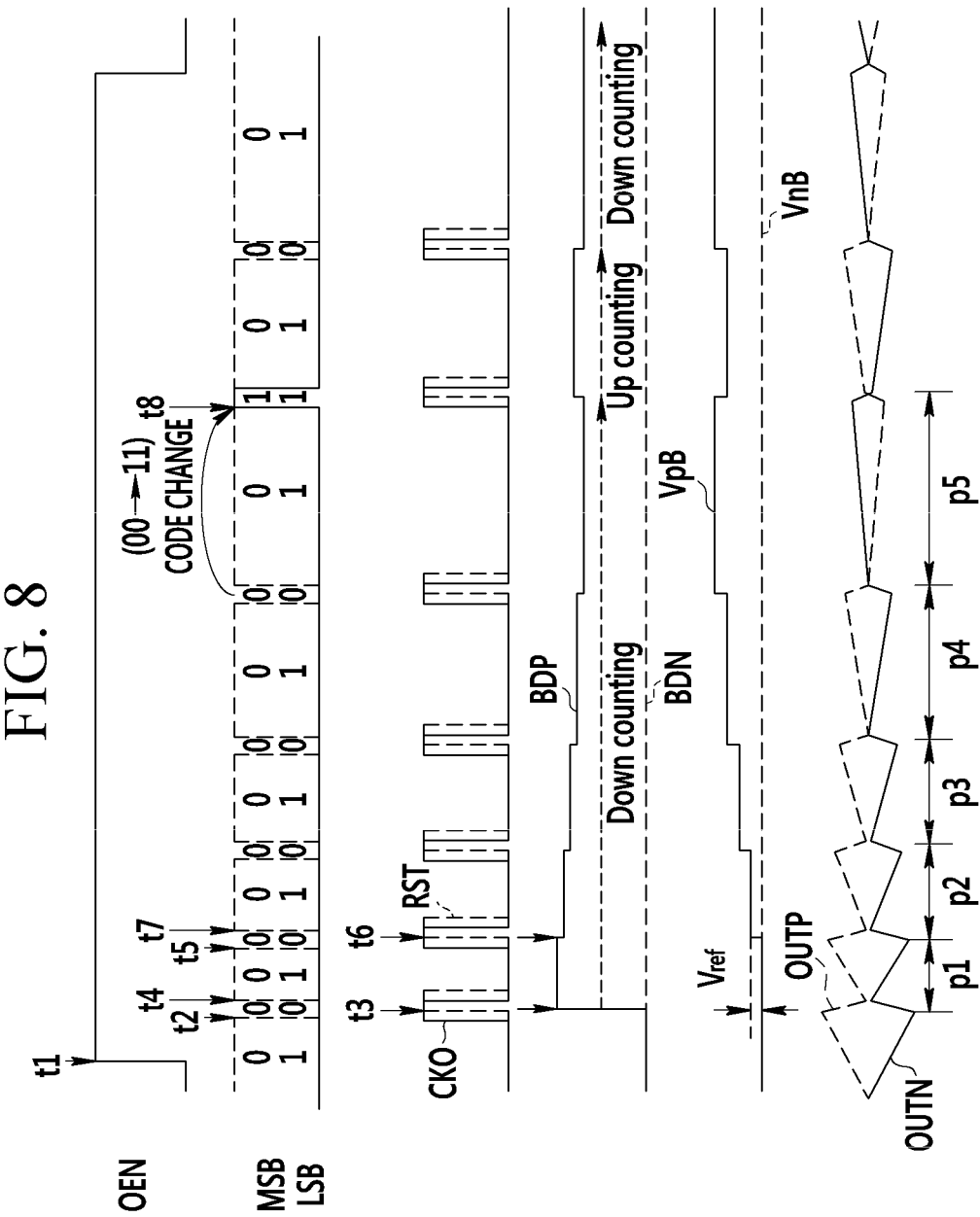
FIG. 8 is a timing diagram of an offset voltage calibration unit that is shown in FIG. 7.

FIG. 8 is a timing diagram of an offset voltage calibration unit that is shown in FIG. 7.

In FIG. 8, it is assumed that a positive offset voltage exists in a negative input signal INN of the OTA 110 and the counter 950 is a 5-bit count, and timing of the offset voltage calibration unit 900 is illustrated.

Referring to FIGS. 6 and 8, when an enable signal OEN becomes a high level (t1), the input multiplexers 710 and 720 output a CM voltage to a positive input terminal and a negative input terminal, respectively, of the OTA 110, and the output multiplexers 810 and 820 output a ground voltage GND and a power supply voltage VDD to the DACs 500 and 600, respectively.

The LPDSM 15' operates according to an operation frequency fs. As shown in FIG. 5, when the CM voltage is input to a positive input terminal and a negative input terminal of the OTA 110, output voltages OUTP and OUTN of the OTA 110 gradually increase. Therefore, when a predetermined time has elapsed, a difference between output voltages Vp and Vn of the OTA 210 increases to reference voltages REFP and REFN or more of the comparators 300 and 400, and thus a value of pulse signals MSB and LSB of the comparators 300 and 400 is changed.

That is, the pulse signals MSB and LSB of the comparators 300 and 400 have a value of 0 and 1 and are changed to 0 and 0 or 1 and 1, respectively, according to an offset voltage. In this case, when a positive offset voltage exists in the negative input signal INN of the OTA 110, the pulse signals MSB and LSB of the comparators 300 and 400 have a value of 0 and 1 and are changed to 0 and 0 at a time point t2 at which a difference between output voltages Vp and Vn of the OTA 210 increases to reference voltages REFP and REFN or more of the comparators 300 and 400.

When the pulse signals MSB and LSB of the comparators 300 and 400 become 0 and 0, the XNOR element 910 outputs a signal of 1 to the AND element 930, and the AND element 930 outputs a signal of 1 that is output from the XNOR element 910 and a high level of signal CKO by an inverted operation frequency fs.

When the high level of signal CKO is output, the counter 950 starts operation and the AND element 940 simultaneously outputs a high level of switch control signal RST. That is, at a time point t3 in response to the high level of signal CKO, the counter 950 enables the DACs 960 and 970 and initializes a count bit value to 11111 according to pulse signals (MSB=0 and LSB=0) of the comparators 300 and 400. The counter 950 outputs low level 4-bit signals (BDP=1111), except for an uppermost level bit to the DAC 960, and outputs a 4-bit signal (BDN=0000) representing 0 V to the DAC 970.

The DAC 960 outputs a voltage, i.e., 0 V corresponding to a low level 4-bit signal (BDP=1111) to a body of the input transistor M1, and the DAC 970 outputs a voltage, i.e., 0 V corresponding to a bit signal (BDN=0000) to a body of the input transistor M2. In FIG. 8, VpB and VnB are voltages that are applied to a body of the input transistors M1 and M2, respectively, and represent output voltages of the DACs 960 and 970.

Because the switch control signal RST becomes a high level by the AND element 940 at a time point t3 in response to the high level of signal CKO, capacitors C1p, C1n, C2p, and C2n are reset. When the capacitor C1p, C1n, C2p, and C2n are reset, all blocks except for an output of the counter 950 and the DACs 960 and 970 are initialized. Accordingly, at a time point t4, the pulse signals MSB and LSB of the comparators 300 and 400 are again changed from 0 and 0 to 0 and 1, and output voltages OUTP and OUTN of the OTA 110 start to gradually increase.

When the pulse signals MSB and LSB of the comparators 300 and 400 become 0 and 1 (t4), the XNOR element 910 outputs a signal of 0 to the AND element 930 and thus a voltage that is applied to a body of the transistors M1 and M2 finally maintains 0 V.

While output voltages OUTP and OUTN of the OTA 110 gradually increase, when a difference between output voltages Vp and Vn of the OTA 210 increases to reference voltages REFP and REFN or more of the comparators 300 and 400 (t5), the pulse signals MSB and LSB of the comparators 300 and 400 are again changed to 0 and 0.

When the pulse signals MSB and LSB of the comparators 300 and 400 are changed to 0 and 0, the AND element 930 outputs a high level of signal CKO, as described above.

The counter 950 down-counts a count bit value from 11111 to 11110 at a time point t6 in response to the high level of signal CKO, outputs a low level 4-bit signal (BDP=1110) to the DAC 960, and outputs 4-bit signal (BDN=0000) to the DAC 970.

The DAC 960 outputs a voltage corresponding to a low level 4-bit signal (BDP=1110) to a body of the input transistor M1. Because the voltage corresponding to the low level 4-bit signal (BDP=1110) is set to a voltage Vref that is increased by a reference voltage Vref from 0 V, a body voltage of the input transistor M1 is increased by the voltage Vref from 0 V. The DAC 970 outputs 0 V to a body of the input transistor M2 to correspond to the 4-bit signal (BDN=0000).

At a time point t6, because the switch control signal RST becomes a high level, the capacitors C1p, C1n, C2p, and C2n are reset. When the capacitors C1p, C1n, C2p, and C2n are reset, all blocks except for an output of the counter 950 and the DACs 960 and 970 are initialized. Accordingly, at a time point t7, the pulse signals MSB and LSB of the comparators 300 and 400 are again changed from 0 and 0 to 0 and 1, and output voltages OUTP and OUTN of the OTA 110 start to gradually increase.

After the output voltage VpB of the DAC 960 is increased to the voltage Vref, the offset voltage calibration unit 900 receives an input of a pulse signal (MSB=0, LSB=0) of the comparators 300 and 400, and operates with the same method as the above-described method. In this case, while a voltage that is applied to a body of the input transistor M1 increases by a voltage Vref, a switching time p2 at which an offset voltage is compensated and in which a state of output voltages OUTP and OUTN is changed becomes longer than a previous time p1.

While the above-described operation is being repeated according to a state of the pulse signals MSB and LSB of the comparators 300 and 400, a voltage that is applied to a body of the input transistor M1 gradually increases. Accordingly, as an offset voltage is compensated, switching times p3-p5 in which a state of output voltages OUTP and OUTN is changed are gradually extended.

In this way, an offset voltage is calibrated, and when a time point at which a switching time in which a state of the output voltages OUTP and OUTN is changed becomes the maximum has elapsed, the pulse signals MSB and LSB of the comparators 300 and 400 are changed to 1 and 1 instead of 0 and 0. This represents that, after all positive offset voltages existing at a negative input signal INN have been calibrated, a negative offset voltage occurs.

When the pulse signals MSB and LSB of the comparators 300 and 400 become 1 and 1 (t8), the counter 950 performs up-counting. Before pulse signals MSB and LSB of the comparators 300 and 400 are changed to 1 and 1, when a low level 4-bit signal of the counter 950 is 1011, the counter 950 up-counts a count bit to 1100.

In this way, when up-counting is performed, an output voltage VpB of the DAC 960 decreases by a reference voltage Vref compared with a previous voltage, and thus while a negative offset voltage is calibrated, a switching time in which a state of output voltages OUTP and OUTN is changed becomes smaller than a maximum time p5.

Thereafter, a low level 4-bit signal BDP of the counter 950 repeatedly has 1011 and 1100 by a repeated operation of the offset voltage calibration unit 900, and thus a voltage VpB that is applied to a body of the input transistor M1 has a repeated value. By such a repetition operation, output voltages OUTP and OUTN of the OTA 110 gradually become similar to a state in which an offset voltage does not exist and thus an offset voltage is calibrated.

In an offset voltage calibration process, an output value of the counter 950 is repeated by up/down counting, and when such a process is shortened, an offset voltage calibration time can be shortened. Hereinafter, a method of shortening an offset voltage calibration time will be described with reference to FIG. 9.

Figure 9:
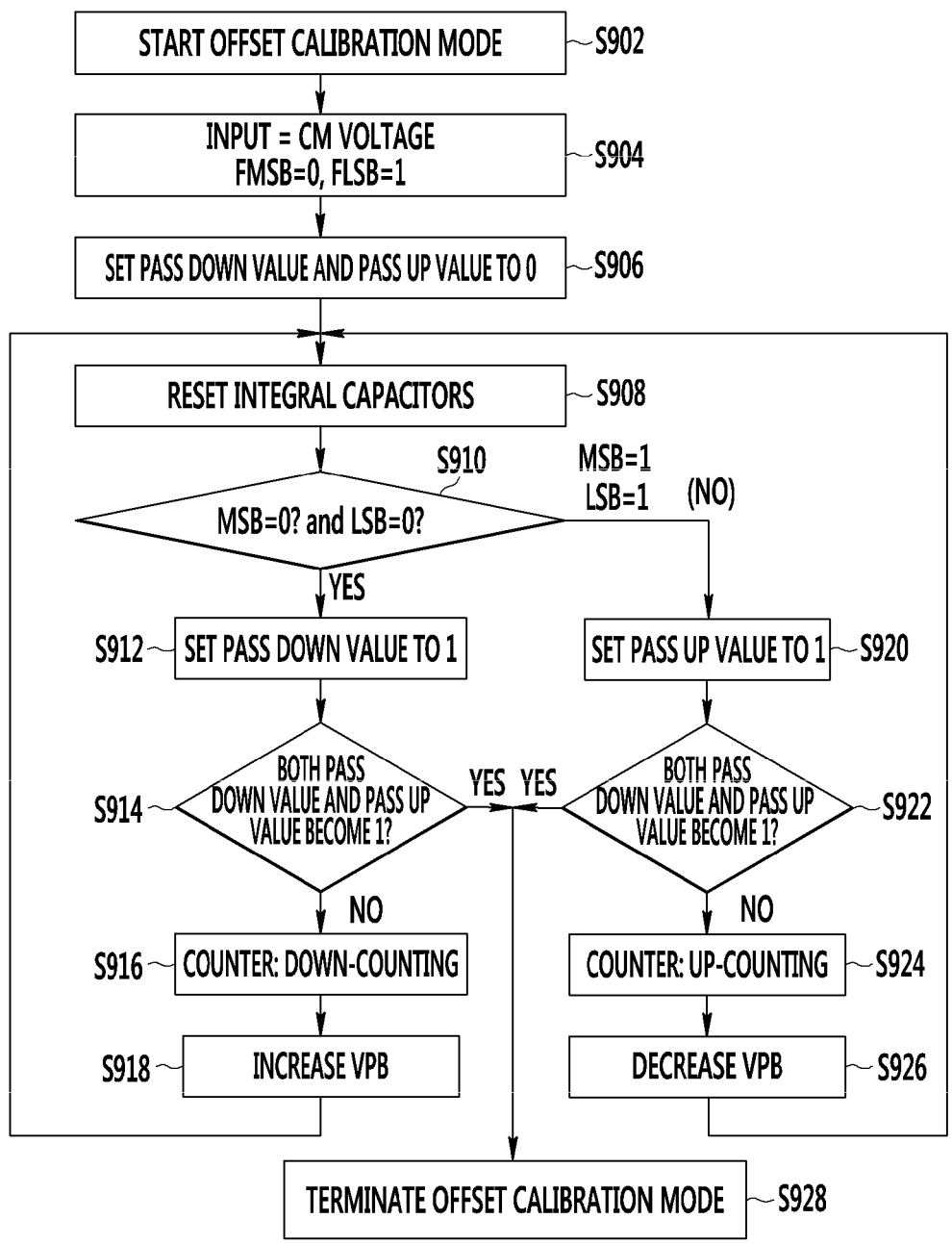
FIG. 9 is a flowchart illustrating a method of calibrating an offset voltage according to an exemplary embodiment of the present invention.
Figure 10:
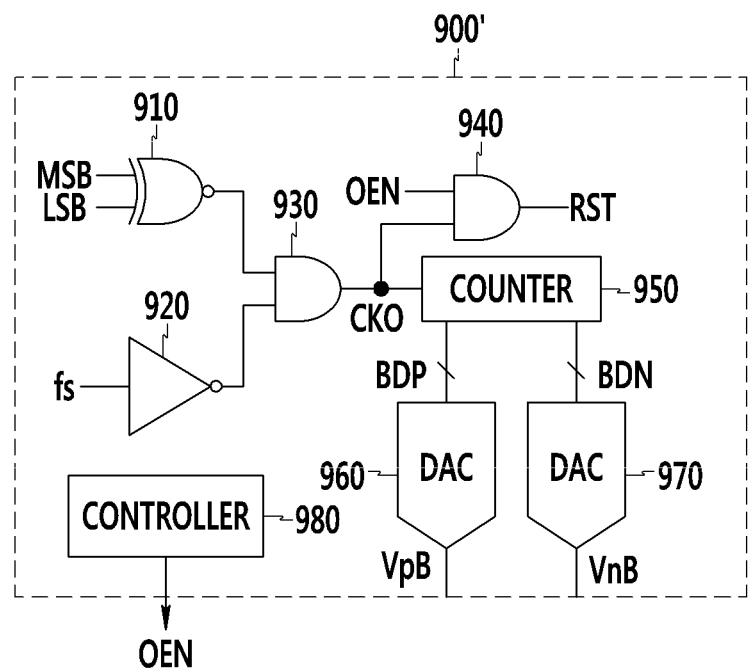
FIG. 10 is a diagram illustrating another example of an offset voltage calibration unit according to an exemplary embodiment of the present invention.

FIG. 9 is a flowchart illustrating a method of calibrating an offset voltage according to an exemplary embodiment of the present invention, and FIG. 10 is a diagram illustrating another example of an offset voltage calibration unit according to an exemplary embodiment of the present invention.

Referring to FIG. 10, an offset voltage calibration unit 900' further includes a controller 980. The controller 980 controls operation of an offset calibration mode. The controller 980 may be embodied within the offset voltage calibration unit 900, but is a separate constituent element from the offset voltage calibration unit 900' and may be embodied as a constituent element of the LPDSM 15'.

Referring to FIG. 9, the controller 980 starts an offset calibration mode (S902). The controller 980 outputs an enable signal OEN of a high level to the input multiplexers 710 and 720 and the output multiplexers 810 and 820 (S904).

The controller 980 defines a pass down value and a pass up value, and initializes the pass down value and the pass up value to 0 (S906).

When an enable signal OEN of a high level is output to the input multiplexers 710 and 720 and the output multiplexers 810 and 820, the offset voltage calibration unit 900' performs an offset voltage calibration operation, as shown in FIG. 8.

In this case, after integral capacitors C1p, C1n, C2p, and C2n are reset (S908), it is determined whether pulse signals MSB and LSB of the comparators 300 and 400 are changed to 0 and 0 (S910), and if pulse signals MSB and LSB of the comparators 300 and 400 are changed to 0 and 0, the counter 950 performs down-counting, and thus the controller 980 sets the pass down value to 1 (S912).

When the pulse signals MSB and LSB of the comparators 300 and 400 are changed to 0 and 0, the counter 950 performs down-counting and thus an output voltage VpB of the DAC 960 increases (S916 and S918), and this operation is repeated until pulse signals MSB and LSB of the comparators 300 and 400 are changed to 1 and 1, as described above.

Thereafter, it is determined whether both the pass down value and the pass up value become 1 (S914), and if both the pass down value and the pass up value become 1, the controller 980 terminates an offset calibration mode (S928).

After integral capacitors C1p, C1n, C2p, and C2n are reset (S908), if pulse signals MSB and LSB of the comparators 300 and 400 are changed to 1 and 1 (S910), the counter 950 performs up-converting and thus the controller 980 sets a pass up value to 1 (S920).

The counter 950 performs up-counting, and thus the output voltage VpB of the DAC 960 decreases (S924 and S926), and this operation is repeated until the pulse signals MSB and LSB of the comparators 300 and 400 are changed to 0 and 0, as described above.

Thereafter, it is determined whether both the pass down value and the pass up value become 1 (S922), and if both the pass down value and the pass up value become 1, the controller 980 terminates an offset calibration mode (S928).

That is, after a time point at which a change time of a state of output voltages OUTP and OUTN becomes the maximum has elapsed, down-counting and up-counting are repeatedly performed and thus when both the pass down value and the pass up value become 1, the controller 980 terminates an offset calibration mode. Thereby, after a change time of a state of output voltages OUTP and OUTN has a maximum length, an additional operation is not performed and thus an offset calibration mode can be efficiently controlled within a short time.

Figure 11:
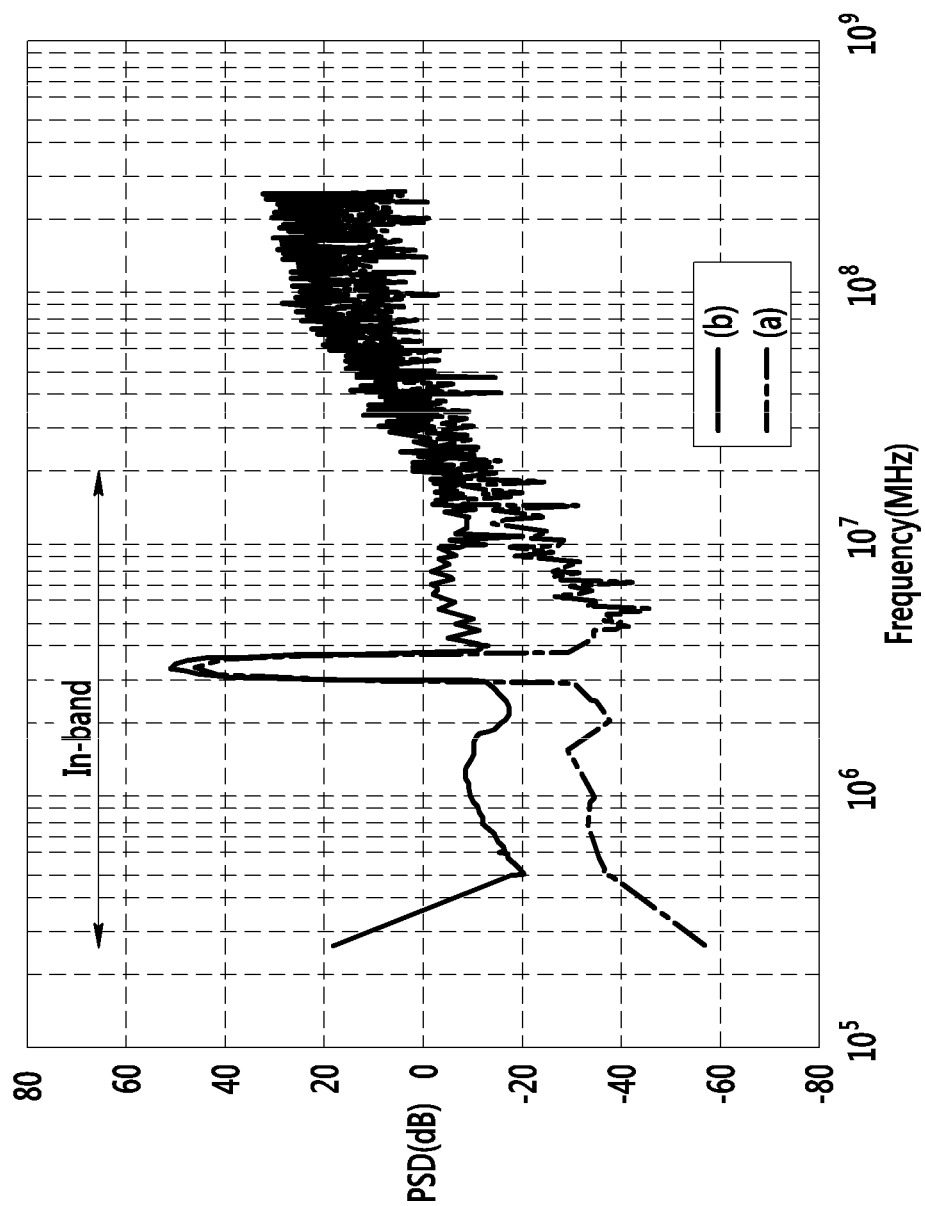
FIG. 11 is a graph illustrating a simulation result of an LPDSM according to an exemplary embodiment of the present invention.

FIG. 11 is a graph illustrating a simulation result of an LPDSM according to an exemplary embodiment of the present invention. Particularly, FIG. 11 is a graph illustrating output FFT characteristics of a case a in which offset voltage calibration technique that is shown in FIGS. 7 and 8 is applied and a case b in which offset voltage calibration technique that is shown in FIGS. 7 and 8 is not applied in an LPDSM that has an offset voltage of 4 mV to an input signal of 3.1 MHz.

As can be seen in curves a and b of FIG. 11, when the offset voltage calibration technique is not applied, it can be determined that a tone is increased in a DC area. An SQNR of this case represents a value of 28.20 dB.

However, when offset voltage calibration technique that is suggested in an exemplary embodiment of the present invention is applied, it can be determined that a tone much decreases in a DC area, and an SQNR of this case represents a value of 45.29 dB, and it can be determined that performance is further improved by about 38% compared to a case in which an offset voltage is not calibrated.

An SQNR through a power spectral density (PSD) is calculated as a value that is a difference between a PSD of a noise signal and a PDS of an input signal in signals of in-band. That is, in FIG. 11, because a simulation was performed with an input signal of about 3.1 MHz, the signal spectrum greatly increases at 3.1 MHz. When a noise signal within a signal processing band (in-band is 20 MHz) of the LPDSM 15 is subtracted from a magnitude of a signal, an SQNR is calculated.

Because all noise components within a band are added and obtained, all noise components cannot be intuitively known and should be obtained through simulation, but values of all noise components within a band can be intuitively approximately determined. For example, in the curve a, a magnitude of a signal is about 45 dB and a largest PSD of noise components is about −5 dB. Therefore, this difference is about 50 dB, and when the remaining noise components are added, the signal has an SQNR of 45.29 dB. In this way, when offset voltage calibration technique is not applied, it can be determined that an SQNR that is obtained through a graph that is shown in FIG. 11 has a value of 28.20 dB, and when the offset voltage calibration technique that is suggested in an exemplary embodiment of the present invention is applied, it can be determined that an SQNR that is obtained through the curve that is shown in FIG. 11 has a value of 45.29 dB.

According to an exemplary embodiment of the present invention, by efficiently removing an offset voltage of a continuous time delta-sigma modulation apparatus, high SQNR characteristics can be obtained.

An exemplary embodiment of the present invention may not only be embodied through the above-described apparatus and/or method but may also be embodied through a program that executes a function corresponding to a configuration of the exemplary embodiment of the present invention or through a recording medium on which the program is recorded, and can be easily embodied by a person of ordinary skill in the art from a description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus that calibrates an offset voltage in a continuous time delta-sigma modulation apparatus comprising a primary integrator and a secondary integrator, the apparatus comprising:
a first logic element that generates a first signal by performing a logic operation of first and second pulse signals representing outputs of the continuous time delta-sigma modulation apparatus and an operation frequency of the continuous time delta-sigma modulation apparatus;
a second logic element that generates a switch control signal that resets an integral capacitor of the primary integrator and an integral capacitor of the secondary integrator by performing a logic operation of the first signal and an enable signal representing the start of an offset calibration mode;
a first digital to analog converter (DAC) that applies a voltage corresponding to a first output bit to a body of a first transistor of the primary integrator;
a second DAC that applies a voltage corresponding to a second output bit to a body of a second transistor of the primary integrator; and
a counter that determines up-counting or down-counting according to the first and second pulse signals and that generates the first and second output bits in response to the first signal and that outputs the first and second output bits to the first and second DACs, respectively.

2. The apparatus of claim 1, wherein in the offset calibration mode, a common mode voltage is input to the primary integrator, and a value that is fed back to the primary and secondary integrators is determined so that the first and second pulse signals have an intermediate value.

3. The apparatus of claim 1, further comprising:
an exclusive-NOR element that performs an exclusive-NOR operation of the first and second pulse signals and that outputs a signal in which the exclusive-NOR operation is performed to the first logic element; and
a logic inversion element that inverts the operation frequency and that outputs the inverted operation frequency to the first logic element.

4. The apparatus of claim 3, wherein the first and second logic elements are each an AND element.

5. The apparatus of claim 1, wherein the first transistor comprises a first input transistor that receives an input of a positive input signal of differential input signals of the primary integrator, and
the second transistor comprises a second input transistor that receives an input of a negative input signal of the differential input signals of the primary integrator.

6. The apparatus of claim 1, wherein the first transistor comprises a first load transistor having a first terminal that is connected to a voltage source that supplies a power voltage and a second terminal that is connected to a first input transistor that receives an input of a positive input signal of differential input signals of the primary integrator, and
the second transistor comprises a second load transistor having a first terminal that is connected to the voltage source and a second terminal that is connected to a second input transistor that receives an input of a negative input signal of the differential input signals.

7. The apparatus of claim 1, wherein one of the first and second output bits is set to be changed according to up-counting or down-counting, and the remaining one is set as a value representing 0 V according to the offset voltage.

8. The apparatus of claim 1, further comprising a controller that defines a pass down value and a pass up value according to a counting method of the counter and that sets the pass down value to 1 when the counter determines down-counting and that sets the pass up value to 1 when the counter determines up-counting, and that terminates the offset calibration mode when both the pass down value and the pass up value are set to 1.

9. A method of calibrating an offset voltage in a continuous time delta-sigma modulation apparatus comprising a primary integrator, a secondary integrator, first and second comparators that determine outputs, the method comprising:
- receiving an enable signal representing an offset calibration mode;
- generating a first signal using pulse signals of the first and second comparators and an operation frequency of the continuous time delta-sigma modulation apparatus;
- generating first and second output bits by determining up-counting or down-counting according to pulse signals of the first and second comparators and performing a counting operation according to the determined counting method;
- applying a voltage corresponding to the first output bit to a body of a first transistor of the primary integrator; and
- applying a voltage corresponding to the second output bit to a body of a second transistor of the primary integrator.

10. The method of claim 9, further comprising resetting an integral capacitor of the primary and secondary integrators according to the first signal.

11. The method of claim 9, wherein a common mode voltage is input to the primary integrator and a value that is fed back to the primary and secondary integrators is determined so that the first and second pulse signals have an intermediate value, according to the enable signal.

12. The method of claim 9, wherein the generating of a first signal comprises:
- performing an exclusive-NOR operation of a pulse signal of the first and second comparators; and
- generating the first signal by performing an AND operation of a signal in which the exclusive-NOR operation is performed and a signal in which an operation frequency of the continuous time delta-sigma modulation apparatus is inverted.

13. The method of claim 9, wherein the generating of first and second output bits comprises:
- determining the up-counting or the down-counting according to a pulse signal of the first and second comparators when a positive offset voltage occurs in a negative input signal of differential input signals of the primary integrator;
- generating the first output bit by performing the up-counting or the down-counting; and
- generating the second output bit with a value representing 0 V.

14. The method of claim 13, wherein the determining of the up-counting or the down-counting comprises:
- determining down-counting when all pulse signals of the first and second comparators are 0; and
- determining up-counting when all pulse signals of the first and second comparators are 1.

15. The method of claim 9, further comprising:
- repeating operations of generating the first signal according to the operation frequency, generating the first and second output bits, and applying them to a body of the first and second transistors;
- setting a pass up value to 1 according to the up-counting, and setting a pass down value to 1 according to the down-counting; and
- terminating the offset calibration mode when both the pass up value and the pass down value are set to 1.

16. A continuous time delta-sigma modulation apparatus comprising:
- an integrator that integrates a differential input signal using a resistor and a capacitor;
- first and second comparators that determine first and second pulse signals, respectively, using a differential input signal of the integrator;
- a first DAC that converts the first and second pulse signals of the first and second comparators to analog values and that feeds back the output signal to the integrator; and
- an offset voltage calibration unit that adjusts a body voltage of one of first and second transistors that receive the differential input signal in the integrator by determining up-counting or down-counting according to the first and second pulse signals and performing a counting operation according to the determined counting method, in an offset calibration mode.

17. The continuous time delta-sigma modulation apparatus of claim 16, further comprising:
- a first multiplexer that selects the differential input signal as a common mode voltage according to an enable signal representing the offset calibration mode; and
- a second multiplexer that selects a value for setting the first and second pulse signals of the first and second comparators to an intermediate value and that outputs the value to the first DAC according to the enable signal.

18. The continuous time delta-sigma modulation apparatus of claim 16, further comprising a switch that is coupled in parallel to a capacitor of the integrator,
wherein the offset voltage calibration unit generates a switch control signal that resets the capacitor according to the first and second pulse signals and outputs the switch control signal to the switch.

19. The continuous time delta-sigma modulation apparatus of claim 16, wherein the offset voltage calibration unit comprises:
- an AND element that generates a first signal by performing an AND operation of a pulse signal of the first and second comparators and an operation frequency of the continuous time delta-sigma modulation apparatus;
- a counter that determines up-counting or down-counting according to a pulse signal of the first and second comparators and that performs counting; and
- a second DAC that applies a voltage corresponding to an output bit of the counter to a body of one of the first and second transistors that receive an input of a differential input signal of the primary integrator.

20. The continuous time delta-sigma modulation apparatus of claim 19, wherein the offset voltage calibration unit further comprises a controller that sets a pass up value to 1 according to an up-counting and that sets a pass down value to 1 according to a down-counting and that terminates the offset calibration mode when both the pass up value and the pass down value are set to 1.

* * * * *